(12) United States Patent
Cheung et al.

(10) Patent No.: US 9,564,344 B2
(45) Date of Patent: Feb. 7, 2017

(54) ULTRA LOW SILICON LOSS HIGH DOSE IMPLANT STRIP

(71) Applicant: Novellus Systems, Inc., Fremont, CA (US)

(72) Inventors: David Cheung, Foster City, CA (US); Haoquan Fang, Sunnyvale, CA (US); Jack Kuo, Pleasanton, CA (US); Ilia Kalinovski, Berkeley, CA (US); Zhao Li, Blacksburg, VA (US); Guhua Yao, Folsom, CA (US); Anirban Guha, Milpitas, CA (US); Kirk J. Ostrowski, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 14/721,977

(22) Filed: May 26, 2015

(65) Prior Publication Data

US 2015/0332933 A1    Nov. 19, 2015

Related U.S. Application Data

(63) Continuation of application No. 12/636,582, filed on Dec. 11, 2009, now abandoned.

(51) Int. Cl.
  *H01L 21/302* (2006.01)
  *H01L 21/461* (2006.01)
  (Continued)

(52) U.S. Cl.
  CPC ........ *H01L 21/31138* (2013.01); *G03F 7/427* (2013.01); *H01L 21/31116* (2013.01);
  (Continued)

(58) Field of Classification Search
  None
  See application file for complete search history.

(56) References Cited

U.S. PATENT DOCUMENTS 4,201,579 A   5/1980   Robinson et al.
4,357,203 A  11/1982   Zelez
(Continued)

FOREIGN PATENT DOCUMENTS

CN   1402316   3/2003
CN   1720349   1/2006
(Continued)

OTHER PUBLICATIONS

U.S. Appl. No. 13/274,638, filed Oct. 17, 2011, entitled "Photoresist Strip Method for Low-K Dielectrics.".
(Continued)

*Primary Examiner* — Stephanie Duclair
(74) *Attorney, Agent, or Firm* — Weaver Austin Villeneuve & Sampson LLP

(57) ABSTRACT

Improved methods for stripping photoresist and removing ion implant related residues from a work piece surface are provided. According to various embodiments, plasma is generated using elemental hydrogen, a fluorine-containing gas and a protectant gas. The plasma-activated gases reacts with the high-dose implant resist, removing both the crust and bulk resist layers, while simultaneously protecting exposed portions of the work piece surface. The work piece surface is substantially residue free with low silicon loss.

21 Claims, 7 Drawing Sheets

(51) Int. Cl.
*B44C 1/22* (2006.01)
*C03C 15/00* (2006.01)
*C03C 25/68* (2006.01)
*C23F 1/00* (2006.01)
*H01L 21/311* (2006.01)
*H01L 21/3213* (2006.01)
*G03F 7/42* (2006.01)

(52) U.S. Cl.
CPC .. *H01L 21/31144* (2013.01); *H01L 21/32136* (2013.01); *H01L 21/32137* (2013.01); *H01L 21/32139* (2013.01)

(56) References Cited

U.S. PATENT DOCUMENTS

| | | | |
|---|---|---|---|
| 4,699,689 A | 10/1987 | Bersin | |
| 4,961,820 A | 10/1990 | Shinagawa et al. | |
| 5,122,225 A | 6/1992 | Douglas | |
| 5,158,644 A | 10/1992 | Cheung et al. | |
| 5,292,393 A | 3/1994 | Maydan et al. | |
| 5,354,386 A | 10/1994 | Cheung et al. | |
| 5,593,541 A | 1/1997 | Wong et al. | |
| 5,626,678 A | 5/1997 | Sahin et al. | |
| 5,633,073 A | 5/1997 | Cheung et al. | |
| 5,651,860 A | 7/1997 | Li | |
| 5,660,682 A | 8/1997 | Zhao et al. | |
| 5,707,485 A | 1/1998 | Rolfson et al. | |
| 5,767,021 A | 6/1998 | Shinichi et al. | |
| 5,773,201 A | 6/1998 | Fujimura et al. | |
| 5,792,269 A | 8/1998 | Deacon et al. | |
| 5,811,358 A * | 9/1998 | Tseng | H01L 21/31138 204/192.36 |
| 5,814,155 A | 9/1998 | Solis et al. | |
| 5,817,406 A | 10/1998 | Cheung et al. | |
| 5,820,685 A | 10/1998 | Kurihara et al. | |
| 5,830,775 A | 11/1998 | Maa et al. | |
| 5,844,195 A | 12/1998 | Fairbairn et al. | |
| 5,895,272 A | 4/1999 | Li | |
| 5,900,351 A | 5/1999 | Lutsic et al. | |
| 5,908,672 A | 6/1999 | Ryu et al. | |
| 5,911,834 A | 6/1999 | Fairbairn et al. | |
| 5,968,324 A | 10/1999 | Cheung et al. | |
| 5,980,770 A | 11/1999 | Ramachandran et al. | |
| 6,013,574 A | 1/2000 | Hause et al. | |
| 6,030,901 A | 2/2000 | Hopper et al. | |
| 6,039,834 A | 3/2000 | Tanaka et al. | |
| 6,045,618 A | 4/2000 | Raoux et al. | |
| 6,054,379 A | 4/2000 | Yau et al. | |
| 6,072,227 A | 6/2000 | Yau et al. | |
| 6,077,764 A | 6/2000 | Sugiarto et al. | |
| 6,083,852 A | 7/2000 | Cheung et al. | |
| 6,086,952 A | 7/2000 | Lang et al. | |
| 6,098,568 A | 8/2000 | Raoux et al. | |
| 6,107,184 A | 8/2000 | Mandal et al. | |
| 6,121,091 A | 9/2000 | Wang | |
| 6,125,788 A | 10/2000 | Hills et al. | |
| 6,127,262 A | 10/2000 | Huang et al. | |
| 6,129,091 A | 10/2000 | Lee et al. | |
| 6,130,166 A | 10/2000 | Yeh | |
| 6,156,149 A | 12/2000 | Cheung et al. | |
| 6,162,323 A | 12/2000 | Koshimizu | |
| 6,171,945 B1 | 1/2001 | Mandal et al. | |
| 6,177,347 B1 | 1/2001 | Liu et al. | |
| 6,184,134 B1 | 2/2001 | Chaudhary et al. | |
| 6,187,072 B1 | 2/2001 | Cheung et al. | |
| 6,193,802 B1 | 2/2001 | Pang et al. | |
| 6,194,628 B1 | 2/2001 | Pang et al. | |
| 6,203,657 B1 | 3/2001 | Collison et al. | |
| 6,204,192 B1 | 3/2001 | Zhao et al. | |
| 6,209,484 B1 | 4/2001 | Huang et al. | |
| 6,230,652 B1 | 5/2001 | Tanaka et al. | |
| 6,242,350 B1 | 6/2001 | Tao et al. | |
| 6,245,690 B1 | 6/2001 | Yau et al. | |
| 6,277,733 B1 | 8/2001 | Smith | |
| 6,281,135 B1 | 8/2001 | Han et al. | |
| 6,287,990 B1 | 9/2001 | Cheung et al. | |
| 6,303,523 B2 | 10/2001 | Cheung et al. | |
| 6,306,564 B1 | 10/2001 | Mullee | |
| 6,319,842 B1 | 11/2001 | Khosla et al. | |
| 6,324,439 B1 | 11/2001 | Cheung et al. | |
| 6,340,435 B1 | 1/2002 | Bjorkman et al. | |
| 6,342,446 B1 | 1/2002 | Smith et al. | |
| 6,348,725 B2 | 2/2002 | Cheung et al. | |
| 6,350,701 B1 | 2/2002 | Yamazaki | |
| 6,352,936 B1 | 3/2002 | Jehoul et al. | |
| 6,358,573 B1 | 3/2002 | Raoux et al. | |
| 6,361,707 B1 | 3/2002 | Tanaka et al. | |
| 6,365,516 B1 | 4/2002 | Frenkel et al. | |
| 6,395,092 B1 | 5/2002 | Sugiarto et al. | |
| 6,413,583 B1 | 7/2002 | Moghadam et al. | |
| 6,426,304 B1 | 7/2002 | Chien et al. | |
| 6,432,830 B1 | 8/2002 | Merry | |
| 6,448,187 B2 | 9/2002 | Yau et al. | |
| 6,465,964 B1 | 10/2002 | Taguchi et al. | |
| 6,511,903 B1 | 1/2003 | Yau et al. | |
| 6,511,909 B1 | 1/2003 | Yau et al. | |
| 6,517,913 B1 | 2/2003 | Cheung et al. | |
| 6,537,422 B2 | 3/2003 | Sakuma et al. | |
| 6,537,929 B1 | 3/2003 | Cheung et al. | |
| 6,541,282 B1 | 4/2003 | Cheung et al. | |
| 6,555,472 B2 | 4/2003 | Aminpur | |
| 6,562,544 B1 | 5/2003 | Cheung et al. | |
| 6,562,690 B1 | 5/2003 | Cheung et al. | |
| 6,569,257 B1 | 5/2003 | Nguyen et al. | |
| 6,593,247 B1 | 7/2003 | Huang et al. | |
| 6,596,655 B1 | 7/2003 | Cheung et al. | |
| 6,632,735 B2 | 10/2003 | Yau et al. | |
| 6,638,875 B2 | 10/2003 | Han et al. | |
| 6,656,832 B1 | 12/2003 | Pan et al. | |
| 6,660,656 B2 | 12/2003 | Cheung et al. | |
| 6,660,663 B1 | 12/2003 | Cheung et al. | |
| 6,663,715 B1 | 12/2003 | Yuda et al. | |
| 6,667,244 B1 | 12/2003 | Cox et al. | |
| 6,669,858 B2 | 12/2003 | Bjorkman et al. | |
| 6,680,164 B2 | 1/2004 | Nguyen et al. | |
| 6,680,420 B2 | 1/2004 | Pang et al. | |
| 6,689,930 B1 | 2/2004 | Pang et al. | |
| 6,693,043 B1 | 2/2004 | Li et al. | |
| 6,709,715 B1 | 3/2004 | Lang et al. | |
| 6,720,132 B2 | 4/2004 | Tsai et al. | |
| 6,730,593 B2 | 5/2004 | Yau et al. | |
| 6,734,115 B2 | 5/2004 | Cheung et al. | |
| 6,743,737 B2 | 6/2004 | Yau et al. | |
| 6,764,940 B1 | 7/2004 | Rozbicki et al. | |
| 6,770,556 B2 | 8/2004 | Yau et al. | |
| 6,777,173 B2 | 8/2004 | Chen et al. | |
| 6,787,452 B2 | 9/2004 | Sudijono et al. | |
| 6,797,188 B1 * | 9/2004 | Shen | H01L 21/02071 134/1.1 |
| 6,800,571 B2 | 10/2004 | Cheung et al. | |
| 6,806,207 B2 | 10/2004 | Huang et al. | |
| 6,837,967 B1 | 1/2005 | Berman et al. | |
| 6,848,455 B1 | 2/2005 | Shrinivasan et al. | |
| 6,858,153 B2 | 2/2005 | Bjorkman et al. | |
| 6,869,896 B2 | 3/2005 | Cheung et al. | |
| 6,900,135 B2 | 5/2005 | Somekh et al. | |
| 6,902,682 B2 | 6/2005 | Shang et al. | |
| 6,930,061 B2 | 8/2005 | Cheung et al. | |
| 7,023,092 B2 | 4/2006 | Yau et al. | |
| 7,070,657 B1 | 7/2006 | Cheung et al. | |
| 7,074,298 B2 | 7/2006 | Gondhalekar et al. | |
| 7,160,821 B2 | 1/2007 | Huang et al. | |
| 7,186,648 B1 | 3/2007 | Rozbicki et al. | |
| 7,202,176 B1 | 4/2007 | Goto et al. | |
| 7,205,249 B2 | 4/2007 | Cheung et al. | |
| 7,227,244 B2 | 6/2007 | Bjorkman et al. | |
| 7,256,134 B2 * | 8/2007 | Kim | H01L 21/31116 156/345.34 |
| 7,288,484 B1 * | 10/2007 | Goto | G03F 7/427 257/E21.218 |
| 7,297,635 B2 | 11/2007 | Toda et al. | |
| 7,344,993 B2 | 3/2008 | Balasubramaniam et al. | |
| 7,390,755 B1 | 6/2008 | Chen et al. | |

(56) References Cited

U.S. PATENT DOCUMENTS

| | | | |
|---|---|---|---|
| 7,432,209 B2 | 10/2008 | Delgadino et al. |
| 7,465,680 B2 | 12/2008 | Chen et al. |
| 7,468,326 B2 | 12/2008 | Chen et al. |
| 7,556,712 B2 | 7/2009 | Yi et al. |
| 7,560,377 B2 | 7/2009 | Cheung et al. |
| 7,569,492 B1 | 8/2009 | Chen et al. |
| 7,585,777 B1 | 9/2009 | Goto et al. |
| 7,595,005 B2 | 9/2009 | Balasubramaniam |
| 7,597,816 B2 | 10/2009 | Chang et al. |
| 7,601,272 B2 | 10/2009 | Nguyen et al. |
| 7,628,864 B2 | 12/2009 | Moriya et al. |
| 7,651,949 B2 | 1/2010 | Jo |
| 7,740,768 B1 | 6/2010 | Goto et al. |
| 7,799,685 B2 | 9/2010 | Savas et al. |
| 8,034,176 B2 | 10/2011 | Tsukamoto et al. |
| 8,058,178 B1 | 11/2011 | Goto et al. |
| 8,058,181 B1 | 11/2011 | Chen et al. |
| 8,097,527 B2 | 1/2012 | Yang |
| 8,129,281 B1 | 3/2012 | Cheung et al. |
| 8,173,547 B2 | 5/2012 | Winniczek et al. |
| 8,193,096 B2 | 6/2012 | Goto et al. |
| 8,435,895 B2 | 5/2013 | Chen et al. |
| 8,444,869 B1 | 5/2013 | Goto et al. |
| 8,591,661 B2 | 11/2013 | Cheung et al. |
| 8,598,037 B2 | 12/2013 | Winniczek et al. |
| 8,641,862 B2 | 2/2014 | Goto et al. |
| 8,716,143 B1 | 5/2014 | Cheung et al. |
| 8,721,797 B2 | 5/2014 | Cheung et al. |
| 2001/0014529 A1 | 8/2001 | Chen et al. |
| 2001/0027023 A1 | 10/2001 | Ishihara |
| 2002/0000202 A1 | 1/2002 | Yuda et al. |
| 2002/0005392 A1 | 1/2002 | Luo et al. |
| 2002/0039625 A1 | 4/2002 | Powell et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0151156 A1 | 10/2002 | Hallock et al. |
| 2002/0153099 A1 | 10/2002 | Wang et al. |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0036284 A1 | 2/2003 | Chou et al. |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0209469 A1 | 10/2004 | Harada et al. |
| 2004/0237997 A1 | 12/2004 | Rui et al. |
| 2004/0245091 A1 | 12/2004 | Karim et al. |
| 2004/0248414 A1 | 12/2004 | Tsai et al. |
| 2005/0022839 A1 | 2/2005 | Savas et al. |
| 2005/0026430 A1 | 2/2005 | Kim et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |
| 2006/0051881 A1 | 3/2006 | Ditizio |
| 2006/0102197 A1 | 5/2006 | Chiang et al. |
| 2006/0138399 A1 | 6/2006 | Itano et al. |
| 2006/0141758 A1 | 6/2006 | Naumann et al. |
| 2006/0154471 A1 | 7/2006 | Minami |
| 2006/0163202 A1 | 7/2006 | Shimizu |
| 2006/0182875 A1 | 8/2006 | Ose et al. |
| 2006/0191478 A1 | 8/2006 | Gondhalekar et al. |
| 2006/0201623 A1 | 9/2006 | Yoo |
| 2006/0289384 A1 | 12/2006 | Pavel et al. |
| 2007/0037396 A1 | 2/2007 | Verhaverbeke |
| 2007/0040172 A1 | 2/2007 | Kawakami et al. |
| 2007/0068900 A1 | 3/2007 | Kim et al. |
| 2007/0144673 A1 | 6/2007 | Yeom |
| 2007/0173066 A1 | 7/2007 | Kokura et al. |
| 2007/0178698 A1 | 8/2007 | Okita et al. |
| 2007/0224826 A1 | 9/2007 | Delgadino et al. |
| 2007/0235137 A1 | 10/2007 | Tsukamoto et al. |
| 2007/0281491 A1 | 12/2007 | Kamp |
| 2008/0026589 A1 | 1/2008 | Hubacek et al. |
| 2008/0044995 A1 | 2/2008 | Kang et al. |
| 2008/0102646 A1 | 5/2008 | Kawaguchi et al. |
| 2008/0160729 A1 | 7/2008 | Krueger et al. |
| 2008/0248656 A1 | 10/2008 | Chen et al. |
| 2008/0286697 A1 | 11/2008 | Verhaverbeke et al. |
| 2009/0053901 A1 | 2/2009 | Goto et al. |
| 2009/0056875 A1 | 3/2009 | Goto et al. |
| 2009/0061623 A1 | 3/2009 | Chang et al. |
| 2009/0117746 A1 | 5/2009 | Masuda |
| 2009/0200268 A1 | 8/2009 | Tappan et al. |
| 2009/0221148 A1 | 9/2009 | Uda et al. |
| 2009/0277472 A1 | 11/2009 | Rivkin et al. |
| 2009/0277871 A1 | 11/2009 | Berry et al. |
| 2010/0015812 A1 | 1/2010 | Nishikawa |
| 2010/0062591 A1 | 3/2010 | Lin et al. |
| 2010/0130017 A1* | 5/2010 | Luo ............... H01J 37/3244 438/710 |
| 2010/0216312 A1 | 8/2010 | Yamamoto et al. |
| 2010/0308463 A1 | 12/2010 | Yu et al. |
| 2011/0006034 A1 | 1/2011 | Hilkene et al. |
| 2011/0031493 A1 | 2/2011 | Yamazaki et al. |
| 2011/0139175 A1 | 6/2011 | Cheung et al. |
| 2011/0139176 A1 | 6/2011 | Cheung et al. |
| 2011/0143548 A1 | 6/2011 | Cheung et al. |
| 2011/0223756 A1 | 9/2011 | Schaeffer et al. |
| 2012/0211462 A1 | 8/2012 | Zhang et al. |
| 2012/0211473 A1 | 8/2012 | Goto et al. |
| 2013/0048014 A1 | 2/2013 | Shaviv et al. |
| 2013/0157465 A1 | 6/2013 | Chen et al. |
| 2014/0080309 A1 | 3/2014 | Park et al. |
| 2014/0120733 A1 | 5/2014 | Cheung et al. |
| 2014/0182619 A1 | 7/2014 | Goto et al. |
| 2015/0357202 A1 | 12/2015 | Thedjoisworo et al. |

FOREIGN PATENT DOCUMENTS

| | | |
|---|---|---|
| CN | 1815697 A | 8/2006 |
| CN | 1868043 | 11/2006 |
| CN | 101015042 | 8/2007 |
| CN | 101057314 A | 10/2007 |
| CN | 101131928 | 2/2008 |
| EP | 0 304 068 | 2/1989 |
| EP | 1 077 476 | 2/2001 |
| EP | 1 081 754 | 7/2001 |
| EP | 1 956 638 | 8/2008 |
| GB | 2300303 A | 10/1996 |
| JP | H05-275326 | 10/1993 |
| JP | H06-208972 | 7/1994 |
| JP | H08-293487 | 11/1996 |
| JP | H09-36099 | 2/1997 |
| JP | H11-087307 A | 3/1999 |
| JP | 2001-308078 | 11/2001 |
| JP | 2003-100718 | 4/2003 |
| JP | 2003-264170 | 9/2003 |
| JP | 2005-268312 A | 9/2005 |
| JP | 2006-073612 | 3/2006 |
| JP | 2006-351594 | 12/2006 |
| JP | 2007-019367 | 1/2007 |
| JP | 2007-053344 | 3/2007 |
| JP | 2007-109744 A | 4/2007 |
| JP | 2007-266610 | 10/2007 |
| JP | 2008-218997 | 9/2008 |
| KR | 10-2004-0103073 | 12/2004 |
| TW | 387097 | 4/2000 |
| TW | 200535277 | 11/2005 |
| WO | WO 2004/051702 | 6/2004 |
| WO | WO 2005/017983 | 2/2005 |
| WO | WO 2006/028858 | 3/2006 |
| WO | WO 2011/071980 | 6/2011 |
| WO | WO 2011/072042 | 6/2011 |
| WO | WO 2011/072061 | 6/2011 |
| WO | WO 2012/018375 | 2/2012 |

(56) References Cited

FOREIGN PATENT DOCUMENTS

OTHER PUBLICATIONS

US Office Action, dated Oct. 14, 2015, issued in U.S. Appl. No. 14/301,155.
US Office Action, dated Jul. 27, 2005, issued in U.S. Appl. No. 10/890,653.
US Final Office Action, dated Jan. 10, 2006, issued in U.S. Appl. No. 10/890,653.
US Office Action, dated Jun. 26, 2006, issued in U.S. Appl. No. 10/890,653.
US Office Action, dated Oct. 11, 2006, issued in U.S. Appl. No. 10/890,653.
US Office Action, dated Apr. 5, 2007, issued in U.S. Appl. No. 10/890,653.
US Notice of Allowance, dated Jun. 15, 2007, issued in U.S. Appl. No. 10/890,653.
US Supplemental Notice of Allowance, dated Jul. 23, 2007, issued in U.S. Appl. No. 10/890,653.
US Office Action, dated Oct. 6, 2008, issued in U.S. Appl. No. 11/859,727.
US Notice of Allowance, dated May 1, 2009, issued in U.S. Appl. No. 11/859,727.
US Office Action, dated Nov. 5, 2010, issued in U.S. Appl. No. 12/533,461.
US Final Office Action, dated May 26, 2011, issued in U.S. Appl. No. 12/533,461.
US Notice of Allowance, dated Aug. 12, 2011, issued in U.S. Appl. No. 12/533,461.
US Office Action dated Feb. 15, 2013, U.S. Appl. No. 13/274,638.
US Notice of Allowance, dated Nov. 28, 2006, issued in U.S. Appl. No. 11/011,273.
US Office Action, dated Dec. 23, 2008, issued in U.S. Appl. No. 11/712,253.
US Office Action, dated Jul. 17, 2009, issued in U.S. Appl. No. 11/712,253.
US Final Office Action, dated Jan. 29, 2010, issued in U.S. Appl. No. 11/712,253.
US Office Action, dated Mar. 1, 2011, issued in U.S. Appl. No. 11/712,253.
US Office Action, dated Nov. 2, 2011, issued in U.S. Appl. No. 12/251,305.
US Notice of Allowance, dated Feb. 17, 2012, issued in U.S. Appl. No. 12/251,305.
US Office Action, dated Apr. 26, 2013, issued in U.S. Appl. No. 13/462,660.
US Notice of Allowance, dated Sep. 30, 2013, issued in U.S. Appl. No. 13/462,660.
US Notice of Allowance, dated Dec. 31, 2013, issued in U.S. Appl. No. 13/462,660.
US Office Action, dated Jul. 11, 2003, issued in U.S. Appl. No. 10/137,096.
US Final Office Action, dated Jul. 27, 2007, issued in U.S. Appl. No. 10/137,096.
US Notice of Allowance, dated Jan. 15, 2008, issued in U.S. Appl. No. 10/137,096.
US Office Action, dated Aug. 25, 2008, issued in U.S. Appl. No. 12/111,095.
US Notice of Allowance, dated Apr. 3, 2009, issued in U.S. Appl. No. 12/111,095.
US Office Action, dated Dec. 8, 2010, issued in U.S. Appl. No. 12/502,130.
US Notice of Allowance, dated Aug. 12, 2011, issued in U.S. Appl. No. 12/502,130.
US Office Action, dated Sep. 6, 2012, issued in U.S. Appl. No. 12/636,582.
US Final Office Action, dated May 13, 2013, issued in U.S. Appl. No. 12/636,582.
US Advisory Action Before the Filing of an Appeal Brief, dated Sep. 20, 2013, issued in U.S. Appl. No. 12/636,582.
US Office Action, dated Dec. 4, 2013, issued in U.S. Appl. No. 12/636,582.
US Office Action, dated Aug. 13, 2014, issued in Application No. 12/636,582.
US Final Office Action, dated Feb. 26, 2015, issued in U.S. Appl. No. 12/636,582.
US Office Action, dated Mar. 30, 2012, issued in U.S. Appl. No. 12/636,601.
US Final Office Action, dated Sep. 5, 2012, issued in U.S. Appl. No. 12/636,601.
US Office Action, dated Feb. 12, 2013, issued in U.S. Appl. No. 12/636,601.
US Notice of Allowance, dated Jul. 23, 2013, issued in U.S. Appl. No. 12/636,601.
US Supplemental Notice of Allowability, dated Nov. 5, 2013, issued in U.S. Appl. No. 12/636,601.
US Office Action, dated Apr. 10, 2014, issued in U.S. Appl. No. 14/066,587.
US Final Office Action, dated Oct. 9, 2014, issued in U.S. Appl. No. 14/066,587.
US Office Action, dated Mar. 18, 2015, issued in U.S. Appl. No. 14/066,587.
US Final Office Action, dated Jul. 10, 2015, issued in U.S. Appl. No. 14/066,587.
US Office Action, dated Jul. 27, 2012, issued in U.S. Appl. No. 12/963,503.
US Final Office Action, dated Jan. 22, 2013, issued in U.S. Appl. No. 12/963,503.
US Office Action, dated Aug. 23, 2013, issued in U.S. Appl. No. 12/963,503.
US Notice of Allowance, dated Feb. 12, 2014, issued in U.S. Appl. No. 12/963,503.
US Notice of Allowance, dated Feb. 17, 2010, issued in U.S. Appl. No. 11/548,801.
US Office Action, dated Nov. 10, 2011, U.S. Appl. No. 12/786,230.
US Final Office Action, dated Apr. 26, 2012, issued in U.S. Appl. No. 12/786,230.
US Notice of Allowance dated Jan. 24, 2013, issued in U.S. Appl. No. 12/786,230.
US Office Action, dated Sep. 13, 2006, issued in U.S. Appl. No. 11/128,930.
US Final Office Action, dated Mar. 8, 2007, issued in U.S. Appl. No. 11/128,930.
US Office Action, dated Mar. 19, 2007, issued in U.S. Appl. No. 11/128,930.
US Office Action, dated Jun. 29, 2007, issued in U.S. Appl. No. 11/128,930.
US Office Action, Dec. 10, 2007, issued in U.S. Appl. No. 11/128,930 dated.
US Final Office Action, dated Jul. 21, 2008, issued in U.S. Appl. No. 11/128,930.
US Office Action, dated Mar. 20, 2009, issued in U.S. Appl. No. 11/128,930.
US Office Action, dated Sep. 17, 2009, issued in U.S. Appl. No. 11/128,930.
US Office Action, dated Feb. 26, 2010, issued in U.S. Appl. No. 11/128,930.
US Final Office Action, dated Sep. 9, 2010, issued in U.S. Appl. No. 11/128,930.
US Office Action, dated May 10, 2011, issued in U.S. Appl. No. 11/128,930.
US Notice of Allowance, dated Oct. 28, 2011, issued in U.S. Appl. No. 11/128,930.
US Office Action dated Feb. 22, 2013, issued in U.S. Appl. No. 13/370,689.
US Final Office Action dated Aug. 20, 2013, issued in U.S. Appl. No. 13/370,689.
US Notice of Allowance dated Jan. 17, 2014, issued in U.S. Appl. No. 13/370,689.
US Office Action dated Oct. 9, 2014, issued in U.S. Appl. No. 13/590,083.
US Final Office Action dated Apr. 27, 2015, issued in U.S. Appl. No. 13/590,083.

(56) References Cited

OTHER PUBLICATIONS

US Office Action dated Sep. 4, 2015, issued in U.S. Appl. No. 13/590,083.
US Office Action, dated Dec. 15, 2009, issued in U.S. Appl. No. 11/696,633.
US Office Action, dated May 26, 2010, issued in U.S. Appl. No. 11/696,633.
US Final Office Action, dated Sep. 20, 2010, issued in U.S. Appl. No. 11/696,633.
US Office Action, dated Jun. 6, 2011, issued in U.S. Appl. No. 11/696,633.
US Final Office Action, dated Sep. 28, 2011, issued in U.S. Appl. No. 11/696,633.
US Office Action, dated Jan. 27, 2012, issued in U.S. Appl. No. 11/696,633.
US Final Office Action, dated May 15, 2012, issued in U.S. Appl. No. 11/696,633.
US Notice of Allowance, dated Oct. 29, 2012, issued in U.S. Appl. No. 11/696,633.
US Office Action, dated Jul. 19, 2013, issued in U.S. Appl. No. 13/759,958.
US Final Office Action, dated Nov. 12, 2013, issued in U.S. Appl. No. 13/759,958.
US Notice of Allowance, dated Apr. 28, 2014, issued in U.S. Appl. No. 13/759,958.
US Notice of Allowance, dated Sep. 22, 2014, issued in U.S. Appl. No. 13/759,958.
Chinese Office Action dated Jul. 20, 2012, issued in Application No. 200810187894.4.
Chinese Office Action dated Jun. 19, 2013, issued in Application No. 200810187894.4.
Japanese Office Action dated Sep. 25, 2012, issued in Application No. 2009-018046.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
Korean Office Action dated Feb. 25, 2015, issued in Application No. 2008-0116792.
Korean Office Action [Final Rejection] dated Sep. 8, 2015, issued in Application No. 2008-0116792.
Taiwan Search Report dated Feb. 17, 2014 issued in TW 097146496.
Taiwan Office Action dated Jun. 19, 2014 issued in TW 097146496.
PCT International Search Report and Written Opinion, dated Jun. 27, 2011, issued in Application No. PCT/US2010/059388.
PCT International Preliminary Report on Patentability and Written Opinion, dated Jun. 21, 2012, issued in Application No. PCT/US2010/059388.
Chinese First Office Action dated Sep. 24, 2014 issued in CN Application No. 201080056124.1.
Chinese Second Office Action dated Jun. 3, 2015 issued in CN Application No. 201080056124.1.
Chinese Third Office Action dated Dec. 10, 2015 issued in CN Application No. 201080056124.1.
Japanese Office Action dated Nov. 11, 2014 issued in JP 2012-543229.
Japanese Office Action (Notice of Reasons for Rejection) dated Sep. 1, 2015 issued in JP 2012-543229.
Singapore Written Opinion and Search Report, dated Feb. 2, 2012, issued in Application No. 201104086-2.
Singapore Second Written Opinion, dated Aug. 17, 2012, issued in Application No. 201104086-2.
Taiwan Office Action and Search Report, dated Nov. 20, 2015, issued in TW 099143367.
PCT International Search Report and Written Opinion, dated Jul. 14, 2011, issued in Application No. PCT/US2010/059517.
PCT International Preliminary Report on Patentability and Written Opinion, dated Jun. 21, 2012, issued in Application No. PCT/US2010/059517.
Chinese First Office Action and Search Report dated Aug. 5, 2014 issued in CN 201080056102.5.
Chinese Second Office Action and Search Report dated Feb. 13, 2015 issued in CN 201080056102.5.
Chinese Third Office Action dated Sep. 28, 2015 issued in CN 201080056102.5.
Japanese Office Action dated Nov. 11, 2014 issued in JP 2012-543254.
Japanese Office Action [Decision of Rejection] dated Sep. 8, 2015 issued in JP 2012-543254.
Singapore Written Opinion, dated Jul. 15, 2013, issued in Application No. 201204092-9.
Singapore Examination Report, dated Mar. 21, 2014, issued in Application No. 201204092-9.
Taiwan Office Action dated Mar. 23, 2015, issued in Application No. 099143368.
Taiwan Office Action [Decision] dated Jul. 14, 2015, issued in Application No. 099143368.
PCT International Search Report and Written Opinion, dated Jul. 13, 2011, issued in Application No. PCT/US2010/059547.
PCT International Preliminary Report on Patentability and Written Opinion, dated Jun. 21, 2012, issued in Application No. PCT/US2010/059547.
Chinese First Office Action and Search Report dated Sep. 1, 2014 issued in CN 201080055428.6.
Chinese Second Office Action dated Jun. 23, 2015 issued in CN 201080055428.6.
Japanese Office Action dated Oct. 28, 2014 issued in JP 2012-543261.
Singapore Written Opinion dated Aug. 1, 2013 issued in Application No. 201203361-9.
Singapore Second Written Opinion dated Apr. 5, 2014 issued in Application No. 201203361-9.
Singapore Final Examination Report dated Nov. 3, 2014 issued in Application No. 201203361-9.
Taiwan Office Action dated Jun. 16, 2015 issued in Application No. 099143366.
European Partial Search Report dated Apr. 17, 2013 issued in Application No. 12 18 1659.
European Partial Search Report dated Aug. 19, 2013 issued in Application No. 12 18 1659.
Singapore Search Report and Written Opinion dated Dec. 13, 2013 issued in SG 201206236-0.
Singapore Search and Examination Report dated Jul. 7, 2014, issued in SG 201206236-0.
Abe et al. (Aug. 2003) "Novel photoresist stripping technology using ozone/vaporized water mixture," IEEE Trans. Semicon. Manufact., 16(3):401-408.
Chung Woody K., (1990) "Downstream Plasma Removal of Mobile Ion Impurity From $SIO_2$," *Published Proceedings of the 8th International Plasma Processing SymposiuM*, Fall, 7 pages.
Chung, Woody K., (1989) "Low Damage, Downstream RF Plasma Ashing of High Energy, Heavily Doped Implanted Resists," *Semicon Korea*, Branson International Plasma Corporation, Hayward, California 94544 U.S.A., 11pp.
De Gendt et al. (1999) "A Novel Resist and Post-Etch Residue Removal Process Using Ozonated Chemistry," *Solid State Phenomena* vols. 65-66:165-168.
Ghandhi, Sorab K., (1983) "VLSI Fabrication Principles," by John Wiley & Sons, Inc., pp. 517-520.
Kalnitsky A. and Chung W. K, "Characterization and Optimization of a Single Wafer Downstream Plasma Stripper," *Journal of the Electrochemical Society*, 135(9):2338-2341.
Kikuchi et al. (Apr. 1994) "Native Oxide Removal on Si Surfaces by NF3-Added Hydrogen and Water Vapor Plasma Downstream Treatment," Jpn J. Appl. Phys. 33:2207-2211, Part 1, No. 4B.
Noda et al. (2003) "Development of a Photoresist Removal Method Using Ozone Gas with Water Vapor for LCD Manufacturing," J. Electrochem. Soc. 150(9):G537-G542.
Wolf S. and Tauber R.N., (1986) (Silicon Processing for the VLSI Era, vol. 1—Process Technology, Lattice Press), pp. 539-543.

\* cited by examiner

ULTRA LOW SILICON LOSS HIGH DOSE IMPLANT STRIP

CROSS-REFERENCE TO RELATED APPLICATIONS

This application is a continuation of and claims priority to U.S. patent application Ser. No. 12/636,582, titled "ULTRA LOW SILICON LOSS HIGH DOSE IMPLANT STRIP", filed Dec. 11, 2009, which is hereby incorporated by reference in its entirety and for all purposes.

FIELD OF INVENTION

The present invention pertains to methods and apparatuses to remove or strip photoresist material and removing related residues from a work piece surface. In certain embodiments, this application relates to methods and apparatus for stripping resist after ion implant or plasma assisting doping implant (low dose or high-dose implanted resist).

BACKGROUND

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting are performed on the uncovered surface and the remaining photoresist. After performing one or more semiconductor processes, the remaining photoresist is removed in a strip operation.

During ion implantation, dopant ions, e.g., ions of boron, boron difluoride, indium, gallium, thallium, phosphorous, arsenic, antimony, bismuth, or germanium, are accelerated toward a work piece target. The ions implant in exposed regions of the work piece as well as in the remaining photoresist surface. The process may form well regions (source/drain) and lightly doped drain (LDD) and doubled diffused drain (DDD) regions. The ion implant impregnates the resist with the implant species and depletes the surface of hydrogen. The outer layer or crust of the resist forms a carbonized layer that may be much denser than the underlying bulk resist layer. These two layers have different thermal expansion rates and react to stripping processes at different rates.

The difference between the outer layer and bulk layer is quite pronounced in post high-dose ion implant resist. In high-dose implantation, the ion dose may be greater than $1 \times 10^{15}$ ions/cm$^2$ and the energy may be from 10 Kev to greater than 100 keV. Traditional high dose implantation strip (HDIS) processes employ oxygen chemistries where monatomic oxygen plasma is formed away from the process chamber and then directed at the work piece surface. The reactive oxygen combines with the photoresist to form gaseous by-products which is removed with a vacuum pump. For HDIS, additional gases are needed to remove the implanted dopants with oxygen.

Primary HDIS considerations include strip rate, amount of residue, and film loss of the exposed and underlying film layer. Residues are commonly found on the substrate surface after HDIS and stripping. They may result from sputtering during the high-energy implant, incomplete removal of crust, and/or oxidation of implant atoms in the resist. After stripping, the surface should be residue free or substantially residue free to ensure high yield and eliminate the need for additional residue removal processing. Residues may be removed by overstripping, i.e., a continuation of the strip process past the point nominally required to remove all photoresist. Unfortunately, in conventional HDIS operations, overstripping sometimes removes some of the underlying functional device structure. At the device layer, even very little silicon loss from the transistor source/drain regions may adversely affect device performance and yield, especially for ultra shallow junction devices fabricated at the <32 nm design rule or below.

What is needed therefore are improved methods and apparatus for stripping photoresist and ion implant related residues, especially for HDIS, which minimizes silicon loss and leaves little or no residue while maintaining an acceptable strip rate.

SUMMARY OF THE INVENTION

Improved methods for stripping photoresist and removing ion implant related residues from a work piece surface are provided. According to various embodiments, plasma is generated using elemental hydrogen, a fluorine-containing gas and a protectant gas. The plasma-activated gases reacts with the high-dose implant resist, removing both the crust and bulk resist layers, while simultaneously protecting exposed portions of the work piece surface. The work piece surface is left substantially residue free with low silicon loss.

These and other features and advantages of the present invention will be described in more detail below with reference to the associated drawings.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "work piece", "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as displays, printed circuit boards, and the like.

As mentioned previously, the methods and apparatus of the invention may be used to efficiently and effectively to remove photoresist materials after high-dose ion implantation. The invention is not limited to high-dose implant strip (HDIS). The invention is also not limited to any particular category of dopants implanted. For instance, described methods and apparatus may be effectively used with stripping after medium or low dose implant. Although specific dopant ions such as boron, arsenic, and phosphorous are discussed, the described methods and apparatus may be effectively used to strip resist impregnated with other dopants, such as nitrogen, oxygen, carbon, germanium, and aluminum.

The methods and apparatus of the present invention use plasmas that are produced from gases that contain hydrogen. In certain embodiments, the gases also contain a weak oxidizing agent, a fluorine-containing gas and a protectant gas, such as $CF_4$. One skilled in the art will recognize that the actual species present in the plasma may be a mixture of different ions, radicals, and molecules derived from the hydrogen, weak oxidizing agent, fluorine containing gas and protectant gas. It is noted that other species may be present in the reaction chamber, such as small hydrocarbons, carbon dioxide, water vapor and other volatile components as the plasma reacts with and breaks down the organic photoresist and other residues. One of skill in the art will also recognize that the initial gas/gases introduced into the plasma is/are often different from the gas/gases that exist in the plasma as well as the gas/gases contact the work piece surface during strip.

Figure 1A:
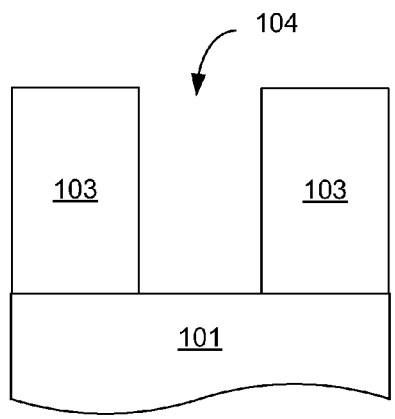
FIGS. 1A-1D depict various stages of semiconductor device fabrication before and after ion implantation and stripping operations.
Figure 1B:
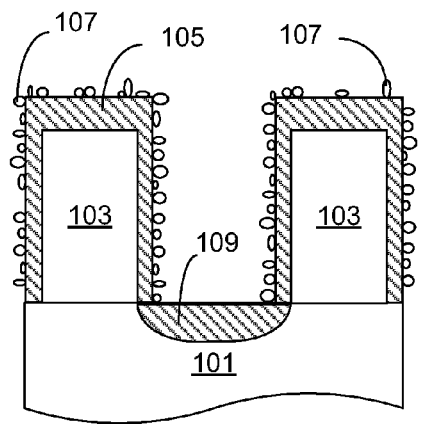

FIG. 1A to 1D depicts various stages of semiconductor fabrication before and after ion implantation and stripping operations. FIG. 1A shows a semiconductor substrate 101 coated with photoresist material 103. The substrate 101 may include one or more layers of deposited film, e.g., oxide film, silicide contact, and/or polysilicon film, or may be a bare silicon substrate, including for example a silicon-on-insulator type substrate. Initially, the photoresist material coats the entire substrate surface. The photoresist is then exposed to patterned radiation generated through a mask and developed to remove a portion of the material, e.g., the opening 104 shown in FIG. 1A between the remaining photoresist materials 103.

The substrate is then exposed to an ion implant process. During ion implant, the surface of the work piece or wafer is implanted with dopant ions. The process may be, for example, a plasma-immersion ion implantation (PIII) or ion beam implantation. The ions bombard the substrate surface, including the exposed silicon layer 101 and the photoresist 103. With high energy ion implantation, small amounts of the underlying material 107 may be sputtered to the photoresist sidewalls. See FIG. 1B. This material may include some of the implant species, other material in the plasma or ion beam, and by-products of the implantation. They include silicon, aluminum, carbon, fluorine, titanium, other contact materials such as cobalt, and oxygen in both elemental and compound forms. The actual species depend on the composition of the substrate before ion implant, the photoresist, and the implanted species.

At the exposed silicon layer 101, a doped region 109 is created. The ion energy or intensity of the bombardment determines the depth or thickness of the doped region. The density of the ion flux determines the extent of doping.

The ions also impregnate the photoresist surface creating a crust layer 105. The crust layer 105 may be carbonized and highly cross-linked polymer chains. The crust is usually depleted of hydrogen and impregnated with the implant species. The crust layer 105 is denser than the bulk resist layer 103. The relative density depends on the ion flux while the thickness of the crust layer depends on the ion energy.

This crust layer 105 is harder to strip than the bulk photoresist 103 below. Removal rates of the crust layer may be 50% or 75% slower than the underlying bulk photoresist. The bulk photoresist contains relatively high levels of chemically bonded nitrogen and some of its original casting solvent. At elevated wafer temperature, e.g., above 150 to above 200° C., the bulk resist can outgas and expand relative to the crust layer. The entire photoresist can then "pop" as the underlying bulk photoresist builds up pressure under the crust. Photoresist popping is a source of particles and process defects because the residues are especially hard to clean from the wafer surface and chamber internal parts. With high-dose ion implantation, the density difference between the crust and underlying bulk photoresist layer is even higher. The crust may also be thicker.

Figure 1C:
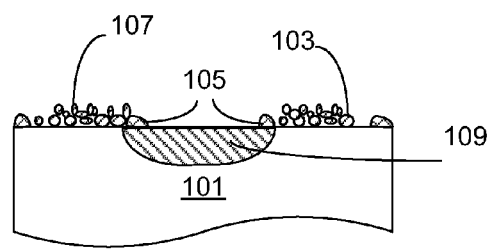

FIG. 1C shows the substrate after a strip that fails to completely remove the photoresist 103 and the sidewall sputter residue 107. The sidewall sputter residue 107 may include particles that do not form a volatile compound under conventional strip chemistries. These particles may remain after a conventional strip operation. The residue may also include oxides of implanted species formed with the reactive oxygen used in the conventional strip chemistry, such as boron oxide and arsenic oxide. Portions of the crust 105 may also remain on the substrate. Crust sidewalls and corners at the bottom of photoresist vias may be hard to strip because of geometries.

These residue particles may be removed by overstripping in some cases, using fluorinated chemistry, or wet cleaning the wafer. Overstripping in conventional oxygen chemistry has been found to cause unwanted silicon oxidation but still not remove boron oxide and arsenic oxide residues if present. Using fluorinated compounds in plasmas generated in accordance with this invention produces fluorine radicals that can form volatile boron fluoride and arsenic fluoride. This helps remove residues but may unfortunately also etch underlying silicon and silicon oxide from the substrate. Use of the particular strip fluorinated chemistries in accordance with embodiments of this invention mitigates this problem.

Silicon loss is a function of resist thickness, crust thickness, and percent overstrip. Longer and more aggressive stripping to remove thicker resist can also remove more silicon. For resist with thicker crust, the difference between the crust layer and bulk resist layer is even more pronounced. The thicker crust sidewalls and corners are even harder to strip. Thus, strip processes designed to remove thick crust also tends to remove more silicon. Overstrip may be used to address resist uniformity and geometries in addition to residue removal. Overstrip is a continuation of the strip process past the point nominally required to remove all photoresist. If the photoresist is totally removed in some areas of the wafer but not others, continuation of the strip process would cause additional material, typically silicon and silicon oxide, to be removed from areas that are already stripped. Typical overstrip is about 100%.

Figure 1D:
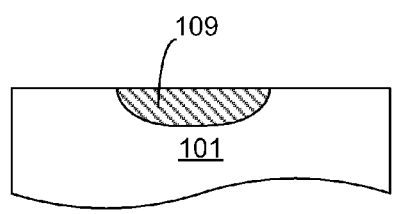

FIG. 1D shows the substrate after all residue has been removed. According to various embodiments, the residue is removed without additional silicon loss or oxidation and with minimum delay. In certain embodiments, the strip process leaves no residue and thus reduces the number of process steps.

Figure 2A:
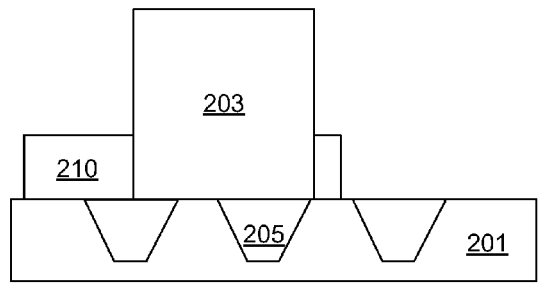
FIGS. 2A-2D depict various stages of semiconductor device fabrication before and after ion implantation and stripping operations according to certain embodiments in which the device includes a metal gate.
Figure 2B:
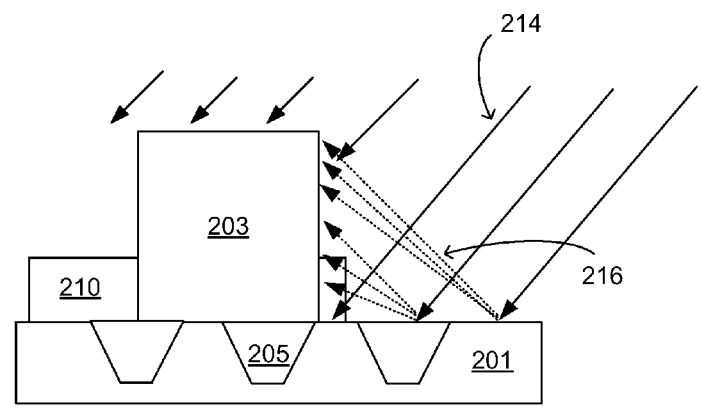
Figure 2C:
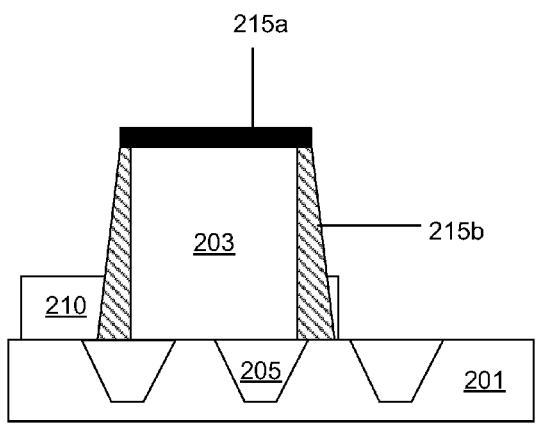
Figure 2D:
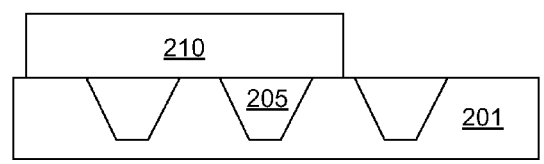

FIGS. 2A-2D depicts various stages of semiconductor fabrication before and after ion implantation and stripping operations for a particular embodiment in which the device includes a metal gate. FIG. 2A shows the partially fabricated device including metal gate stack 210 and patterned photoresist 203 on semiconductor substrate 201 prior to ion implantation. Note that patterned photoresist 203 partially obscures the view of metal gate stack 210 in the depicted figure. In certain embodiments, substrate 201 is a silicon-on-insulator substrate. Shallow trench isolation (STI) regions 205 are embedded with substrate 201 and are generally trenches filled with an insulating material such as silicon oxide. FIG. 2B shows the device during implantation, including ion beam flux 214 and resputter flux 216. The resputter flux 216 deposits substrate materials (Si, STI and SiN) on the sidewall. After implantation, a crust 215 is formed on the top (215a) and sidewalls (215b) of the bulk photoresist 203 as shown in FIG. 2C. The top crust 215a and side crust 215b may see different environments during implantation due to the angle of the ion implant beam flux 214 as well as the sidewall deposition from the resputter flux 216. Using the processes described herein, the bulk photoresist 203 and crust formations 215a and 215b are removed, leaving an undamaged metal gate 210 and minimal loss of surface material from the surfaces of substrate 201 and STI regions 205, as shown in FIG. 2D.

The methods described herein remove photoresist and residues while minimizing silicon loss and damage to the gate stack. According to various embodiments, the metal gate stack can include one or more of titanium nitride (TiN), Ta, TaN, or W. A high-k gate dielectric such as hafnium oxide, zirconium oxide and titanium oxide may be disposed between the substrate and metal gate. Unlike polysilicon gates, metal gates are incompatible with conventional oxygen-based strip chemistries. Moreover, conventional oxygen-based chemistries result in high silicon loss.

One aspect of the invention relates to novel strip chemistries for high dose implant resist and residue removal that limit silicon loss. According to various embodiments, the photoresist and residues are exposed to a plasma formed from molecular hydrogen, a weak oxidizing agent, a fluorine-containing compound and a protectant compound. The disclosed processes achieve a substantially residue free strip process with minimal silicon loss and are compatible with metal gates. Without being bound by any particular theory or mechanism of reaction, it is believed that fluorine radicals in the plasma combine with hydrogen in the process gas to form hydrogen fluoride (HF) instead of remaining as fluorine radicals. The silicon loss is believed to be reduced in part because the protectant compound reacts with the surface silicon to form protective polymerized films, carbides, nitrides or other non-oxide protective layers, which have lower etch rates than oxides in HF.

Process Chemistries

As indicated, the strip process involves generating a plasma from a gas including various component gases. The strip chemistries described herein are hydrogen-based, rather than oxygen-based. Molecular hydrogen ($H_2$) is the main component of the plasma-generating gas, with 1,000-40,000 sccm, e.g., 1,000-6,000 sccm, $H_2$ run in the background, with example flow rates of other components of the plasma-generating gas being at least an order of magnitude. According to various embodiments, the other component gases include a fluorine-containing compound and a protectant compound. In many embodiments, carbon dioxide or other weak oxidizing agent is included, though in certain embodiments it is not.

Examples of weak oxidizing agents include carbon oxides such as carbon dioxide ($CO_2$), carbon monoxide (CO), nitrogen oxides such as nitrous oxide ($N_2O$), nitric oxide (NO), nitrogen dioxide ($NO_2$), and sulfur oxides such as sulfur oxide (SO) and sulfur dioxide ($SO_2$). Examples of other weak oxides include any oxygen containing hydrocarbons ($C_xH_yO_z$) and water ($H_2O$). In certain embodiments the weak oxidizing agent is a carbon-containing compound. In particular embodiments, carbon dioxide is used as the weak oxidizing agent because it is cheap, safe, and effective.

The fluorine-containing gas can be nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. In particular embodiments, the fluorine-containing gas is $NF_3$, $SF_6$, $F_2$, or HF vapor. As described below, it has been found that these gases are superior strip gases than certain carbon-containing etchants such as $CF_4$. In certain embodiments, the fluorine-containing compound is a non-carbon containing compound. In a particular embodiment, $NF_3$ is used as the fluorine-containing gas. As discussed above, it is believed that the main etchant component in the chamber during the strip is HF vapor. Accordingly, in certain embodiments, any fluorine-containing gas that readily converts to HF vapor may be used.

The protectant compound is generally a carbon-containing compound, though in certain embodiments it may be a nitrogen-containing compound. In certain embodiments, the protectant gas may also be a fluorine-containing compound. For example, in certain embodiments, the protectant compound is $CF_4$. It should be noted that the process chemistry generally includes both a fluorine-containing compound (e.g., $NF_3$) and a protectant compound ($CF_4$), where these compounds are distinct. That is, even where the protectant compound contains fluorine, a distinct fluorine-containing compound is provided as well. In certain embodiments, the fluorine-containing compound is a significantly stronger etchant than the protectant compound. In certain embodiments, the protectant compound is a carbon-containing compound, with examples including $CF_4$, and $CH_4$. In certain embodiments, the protectant compound is a nitrogen-containing compound. Without being bound by a particular theory or mechanism, it is believed that the protectant compound reacts with, or provides reactant species to react with, the silicon/silicon oxide surfaces, forming for example, carbides and nitrides, that are more resistant to etching. For example, the etch rate of a nitride in HF is on the order of about 50 times less than that of an oxide, with the etch rate of a carbide about at least about an order of magnitude less than that of a nitride. In certain embodiments, oxygen-containing compounds may be employed as protectant compounds, so long as the compounds are not strong oxidants.

In a particular embodiment, the strip chemistry is $H_2/CO_2/NF_3/CF_4$, with example relative volumetric ratios being 100/0.1-1/0.5-4/2-5. In one example, a ratio is 3000/32/15/100. The total flow rate of gas, the relative amount of weak oxidizing agent, fluorine-containing gas, protectant gas and other conditions in the strip chamber can vary depending upon, among other factors, plasma type (downstream versus direct), RF power, chamber pressure, substrate (wafer) size and type of weak oxidizing agent, fluorine-containing gas and protectant gas used. Based on a 300 mm wafer in a Novellus Gamma™ system, the total flow rate of gas may range between about 1,000 sccm and about 40,000 sccm with the flow rate of carbon dioxide about 1 sccm and about 400 sccm and RF power will preferably range between about 300 Watts to about 5000 Watts. Chamber pressures will typically range between about 300 mTorr and about 2 Torr, e.g., between about 800 mTorr and about 1.6 Torr.

As discussed further below, in certain embodiments, the ratios of fluorine-containing gas and protectant gas are varied in certain process sequence to provide complete photoresist and residue removal and low silicon loss. Also as discussed further below, the carbon dioxide or other weak oxidizing agent is controlled to reduce silicon loss.

Process Sequences

In certain embodiments, process sequences effective to remove the high dose implant crust and residue removal are provided. In certain embodiments, the process sequences involve varying the ratio of the fluorine-containing gas and the protectant gas during the process sequence to provide the necessary removal. In certain embodiments, the process sequences involve an operation in which the wafer is exposed to a plasma generated from a gas including a fluorine-containing and protectant component gases followed by an operation in which the wafer is exposed to a plasma generated from a fluorine-containing gas only. In certain embodiments, these operations may be reversed.

Figure 3A:
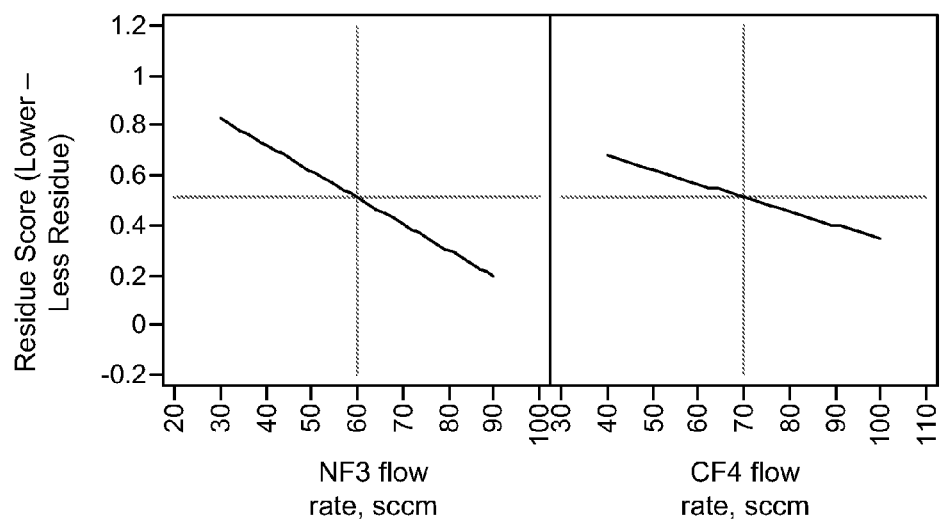
FIG. 3A shows residue remaining as functions of NF3 flow rate and CF4 flow rate.
Figure 3B:
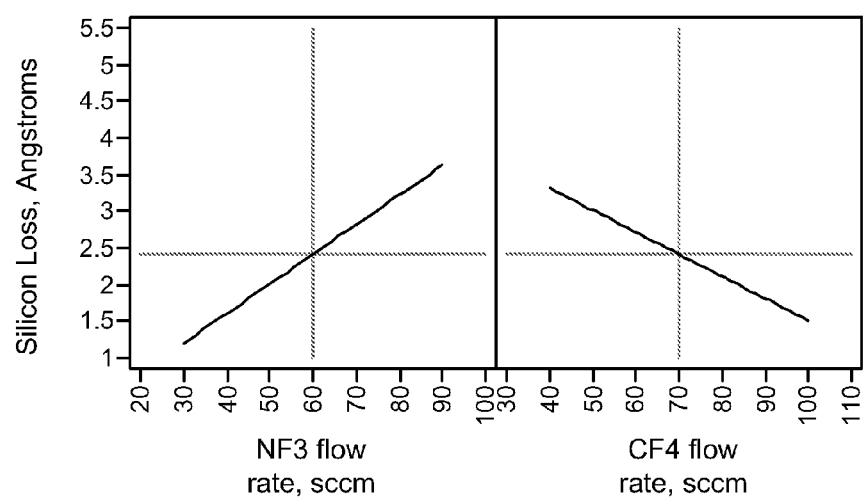
FIG. 3B shows silicon loss as functions of NF3 flow rate and CF4 flow rate.

FIGS. 3A and 3B show experimental results indicating that the fluorine-containing gas (NF3) and a protectant gas (CF4) may be employed to both reduce residue and reduce silicon loss. FIG. 3A shows a residue score, which indicates the amount of residue, as functions of NF3 and CF4 flow rates (with the other compound held at constant flow rate). As flow rate increases, the residue decreases due to the increased presence of fluorine. Note that in embodiments wherein the protectant gas is not a fluorine-containing compound, the curve for the protectant gas may be flattened. FIG. 3B shows silicon loss as functions of NF3 and CF4 flow rates. Silicon loss increases with increasing NF3 flow rate, due to the etching of the surface by activated fluorine species and/or fluorine-containing compounds in the plasma. However, silicon loss decreases with increasing CF4 flow rate at a fixed NF3 flow rate such as 60 sccm as indicated on FIG. 3B. The slope of the CF4 response is higher or lower depending on NF3 flow rate—illustrating the importance of having the right ratio. As indicated above, it is believed that the decrease in silicon loss with higher CF4 flow rates (contrary to what would normally be expected with increasing fluorine) may be due to the formation of a carbon-containing protective film at the substrate surface. The protective film may be formed by a polymerization reaction between carbon species and the silicon surface material. The use of a fluorine-containing protective gas allows the protectant gas to simultaneously provide a protective effect as well as (along with the fluorine-containing gas) provide residue removal.

If NF3 is used alone (e.g., in a H2/CO2/NF3 process), the residue may all be removed, but at an unacceptably high silicon loss. If CF4 is used alone (e.g., in a H2/CO2/CF4 process), the removal process will be significantly slower, and may not result in complete removal. According to various embodiments, the process includes at least one operation that uses a combination of NF3 and CF4. For example, in one embodiment, a post-high implant dose (post-HDI) wafer may be placed into a strip chamber. After pre-heating the wafer, H2/CO2/CF4/NF3 gas is introduced in the chamber, and a plasma struck. The wafer is exposed to the plasma for a period of time sufficient to clean the crust, bulk photoresist and other residue.

In certain embodiments, the process sequence varies the relative amount of NF3 (or other fluorine-containing gas) and CF4 (or other protectant gas). Depending on the type of resist, ion implanted and implantation parameters, different process sequences may be employed. Below are descriptions of sequences or parts of sequences that may be employed to remove parts of the bulk photoresist, crust and sputter residue, along with examples of process sequences for stripping various post-implant photoresist and residue formations. For simplicity, the below description refers to NF3 and CF4, however, it should be understood that other fluorine-containing and protectant gases, respectively may be employed for either of these component gases. In certain embodiments, a two step process for removing side and top crusts is employed, involving NF3+CF4, followed by NF3 only. (H2 and optionally CO2 are run in the background for all strip operations). The two step process is employed to remove the side crust (NF3+CF4) followed by the top crust (NF3 only). The NF3 only operation may involve a fluorine "spike" or "burst" in which the NF3 flow rate is increased by two or more times. For example, the following per-station flow rates may be applied: First operation (side crust): 2-3 liters per minute (lpm) H2; 32 sccm CO2; 100 sccm CF4; 15 sccm NF3. Second operation (top crust): 2-3 lpm H2; 32 sccm CO2; 0 sccm CF4; 50 sccm NF3. It should be noted that the flow rates described may be scaled up or down depending on the size and configuration of the reactor, wafer size, and dose time. It has been found that in certain cases using NF3 only, for an acceptable level of silicon loss, the top crust is removed, but the side crust is not removed. It has also been found that in certain cases using NF3+CF4, for an acceptable level of silicon loss, removes the side crust but not the top crust. Accordingly, employing a two-step process as discussed allows removal of both the side and top crusts.

Figure 4:
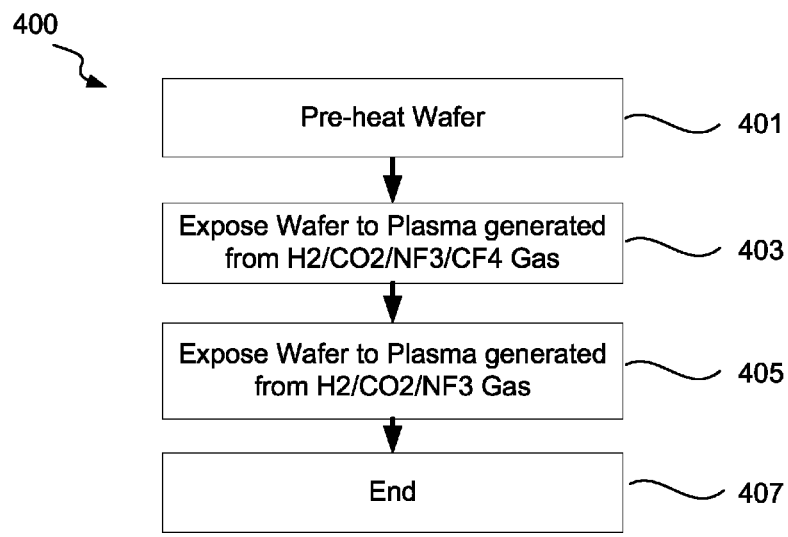
FIGS. 4 and 5 are a process flow diagrams showing various operations in accordance with certain embodiments of the present invention.

FIG. 4 describes a process flow 400 for removing photoresist and crusts according to various embodiments. First in an operation 401, the wafer is pre-heated to a temperature low enough to prevent popping, but high enough to provide an acceptable etch rate. According to various embodiments, this may be between 200 C-400 C, more particularly between 240 C-350 C, e.g., at 285 C. At operation 403, the wafer is exposed to a plasma generated from hydrogen, carbon dioxide, nitrogen trifluoride and carbon tetrafluoride (H2/CO2/NF3/CF4). Generating the plasma generally involves introducing the component gases (which may be pre-mixed or not) into a plasma source. Various types of plasma sources may be used in accordance with the invention, including RF, DC, and microwave based plasma sources. In certain embodiments, the plasma is a remote plasma source though it may also be in-situ (i.e., in the strip chamber). This first operation may remove the side crust and the bulk photoresist, while protecting the surface from silicon loss. Then in an operation 405, the CF4 flow is turned off, and the wafer is exposed to a plasma generated from hydrogen, carbon dioxide and nitrogen trifluoride (H2/CO2/NF3) only. This operation removes the top crust residue. After removing byproducts (not shown), the process ends at an operation 407, and the cleaned wafer may be removed.

Figure 5:
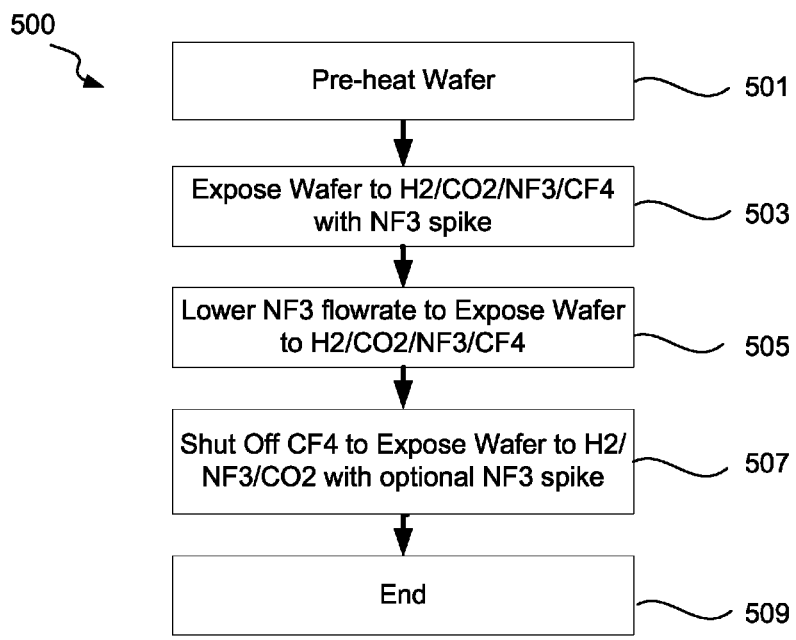

In certain embodiments, in addition to or instead of turning off the CF4, the CF4/NF3 ratio may be changed as necessary by increasing or decreasing the flow rates. For example, in certain embodiments, a combination of CF4 and NF3 is employed to remove the bulk photoresist and/or side crusts. NF3 is spiked at various points in the process to provide additional removal for residues not easily removed. Spiking NF3 may or may not involve reducing or turning the CF4 flow. FIG. 5 shows an example of such a process 500 according to various embodiments. As with the previous example, the wafer is first pre-heated in an operation 501. Then the wafer is exposed to a plasma generated from H2/CO2/NF3/CF4, with NF3 spiked, in an operation 503. This operation may remove the crust while protecting against silicon loss. In certain embodiments, both top and side crusts may be removed. Then in an operation 505, the NF3 flow rate is reduced and the wafer is exposed to a plasma generated from H2/CO2/NF3/CF4 for removal of the bulk photoresist. In an operation 507, the CF4 flow is turned off and the wafer is exposed to a plasma generated from H2/CO2/NF3. The NF3 is optionally spiked during this operation. This operation may be an overstrip operation to completely remove any remaining residue. Overstripping refers to a continuation of the strip process past the point nominally required to remove all photoresist, and may involve stripping material from already cleaned surfaces. After removing byproducts (not shown), the process ends at an operation 509, and the cleaned wafer may be removed.

As indicated, depending on the particular post-implant photoresist and residue formation on the wafer or other work piece, spiking NF3 may be done at different stages in the process. For example, NF3 may be spiked at the beginning of the removal process to facilitate difficult top crust removal. The top crust may be removed at the beginning of the process to prevent the possibility of popping. Bulk photoresist removal may then be performed using a lower NF3 flow rate in combination with CF4. In certain embodiments, NF3 is spiked after removal of the bulk photoresist to facilitate stringer removal. Stringers are long, narrow photoresist residue segments that may be left by non-exposure between two adjacent exposure areas.

In certain embodiments, the NF3 and CF4 ratio during removal of all or part of the bulk photoresist may be considered to be a "base" ratio, with spikes measured relative to this ratio. So for example, taking a NF3:CF4 during bulk photoresist removal to be a "base," according to various process sequences the ratio may be raised prior to and/or after the bulk photoresist removal. In one example, the base ratio is 3:20 (e.g., 15 sccm NF3, 100 sccm CF4) with a spike raising the ratio to 1:2 (50 sccm NF3, 100 sccm CF4), or in cases in which CF4 is not present, infinity. The actual flow rates and ratios employed for any particular process may vary; however by changing the relative flow rates and the ratio, the removal process can be controlled using the effects shown in FIGS. 3A and 3B. In certain embodiments, CF4 only and no NF3 may be present for one or more operations, however, in many embodiments, CF4 has been found to provide adequate protection allowing the process to take advantage of the higher removal rate of NF3.

According to various embodiments, a base ratio of 1:50-1:2 may be employed, with a spike being higher than the base ratio. In certain embodiments, a NF3 spike may involve at least doubling the ratio of NF3:CF4.

Figure 6:
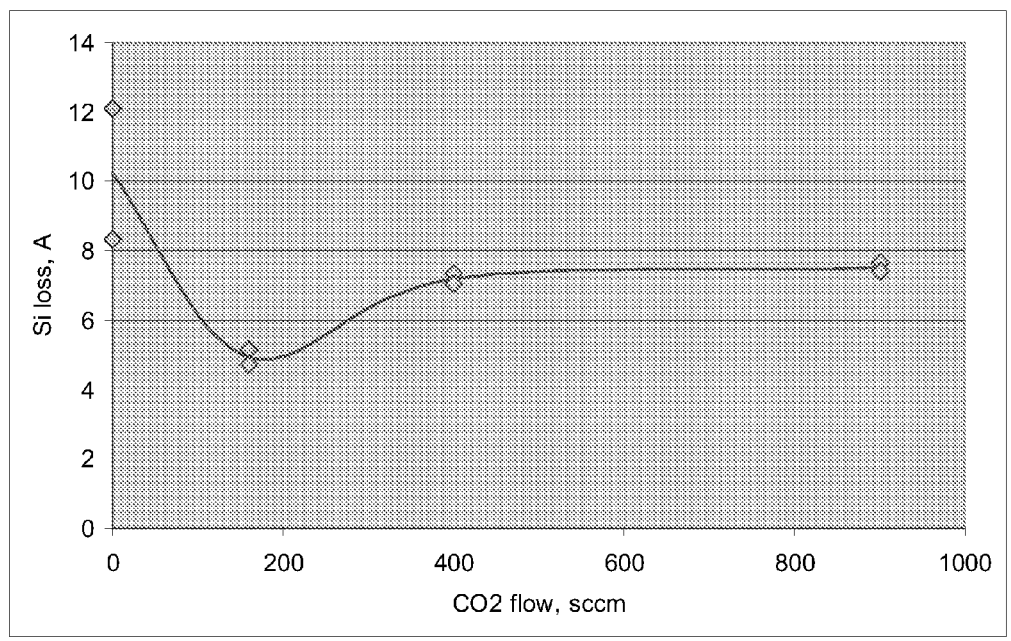
FIG. 6 shows silicon loss as a function of CO2 flow rate.

As indicated above, in certain embodiments, a CO2 bleed gas is employed, and run at all times with H2. It has been found that for a 300 mm wafer, using 10-15 lpm H2 (2-3 lpm per station), running between about 100 sccm-300 sccm CO2 (20 to 60 sccm per station) results in less silicon loss than outside this range. This is shown in FIG. 6. The flow rates in FIG. 6 reflect the total CO2 over a 5-station chamber; on a per-station basis, the wafer sees 20 sccm-60 sccm CO2, more particularly 32 sccm.

Process Parameters

Inlet Gas

A hydrogen-containing gas, typically including molecular hydrogen, is introduced to the plasma source. The gas introduced to the plasma source contains the chemically active species that will be ionized or otherwise in the plasma source to form a plasma. The gas introduced to the plasma source includes a fluorine-containing gas such as elemental fluorine, nitrogen trifluoride, and sulfur hexafluoride. The gas introduced to the plasma includes a protectant gas, typically a carbon-containing protectant gas. In certain embodiments, the protectant gas is a fluorocarbon gas, such as carbon tetrafluoride, $C_2F_6$ or a hydrofluorocarbon.

In certain specific embodiments, the gas introduced to the plasma source comprises between about 0.1% to about 3% carbon tetrafluoride by volume and about 0.3% to 2% nitrogen trifluoride by volume. The gas introduced to the plasma source may include a weak oxidizing agent such as carbon dioxide, carbon monoxide, nitrogen dioxide, nitrogen oxide and/or water. In certain embodiments, the weak oxidizing agent is carbon dioxide. According to various embodiments, the inlet gas may include between about 1 and 99 volume percent, about 80 and 99.9 volume percent, or about 95 volume percent molecular hydrogen, between about 0 and 25 volume percent CO2 or other weak oxidizing agent, between about 0.1 and 3 volume percent nitrogen trifluoride or other non-carbon containing fluorine-containing compound and between about 0.1 and 6% volume percent carbon tetrafluoride or other protectant compound.

In certain embodiments, the gas inlet to the plasma source consists essentially of molecular hydrogen, carbon dioxide or other weak oxidizing agent, non-carbon containing fluorine-containing compound, and protectant compound. In certain embodiments wherein the protectant gas flow is shut off in one or more operations in a process sequence, the gas inlet to the plasma source consists essentially of molecular hydrogen, carbon dioxide or other weak oxidizing agent and non-carbon containing fluorine-containing compound. In other embodiments, an additional one or more gasses may be added to the process gas. For example, an inert gas may be added.

The gas introduced to the plasma source may be premixed, partially mixed or unmixed. Individual gas sources may flow into a mixing plenum before being introduced to the plasma source. In other embodiments, the different gases may separately enter the plasma source. The gas introduced to the plasma source may have different compositions when used in different reaction stations of a multistation chamber. For example in a 6-station chamber, station 1 (or station 2, if station 1 is used for pre-heat) or station 6 may employ process gases with relatively higher amounts of NF3 gas to remove the crust or the residue, respectively. One or more of the other stations may employ process gases with little or no protectant gas. Process gases with no carbon dioxide or weak oxidizing agents may also be used.

Methods of stripping photoresist and etch materials using hydrogen-based plasmas with weak oxidizing agents are disclosed in U.S. Pat. No. 7,288,484, which is hereby incorporated by reference in its entirety and for all purposes. Post-HDI methods of stripping photoresist and etch residue are described in U.S. Patent Publication No. US-2009-0053901, which is hereby incorporated by reference in its entirety and for all purposes.

Plasma Generation

Various types of plasma sources may be used in accordance with the invention, including RF, DC, and microwave based plasma sources. In a preferred embodiment, a downstream RF plasma source is used. Typically, the RF plasma power for a 300 mm wafer ranges between about 300 Watts to about 10 Kilowatts. In some embodiments, the RF plasma power is between about 2000 Watts and 5000 Watts, e.g., 3500 W.

Showerhead Assembly

According to various embodiments of the present invention the plasma gas is distributed to the work surface via a showerhead assembly. The showerhead assembly may be grounded or have an applied voltage to attract some charge species while not affecting the flow of neutral species to the wafer, e.g., 0-1000 watt bias. Many of the electrically charged species in the plasma recombine at the showerhead. The assembly includes the showerhead itself which may be a metal plate having holes to direct the plasma and inert gas mixture into the reaction chamber. The showerhead redistributes the active hydrogen from the plasma source over a larger area, allowing a smaller plasma source to be used. The number and arrangement of the showerhead holes may be set to optimize strip rate and strip rate uniformity. If the plasma source is centrally located over the wafer, the showerhead holes are preferably smaller and fewer in the center of the showerhead in order to push the active gases toward the outer regions. The showerhead may have at least 100 holes. Suitable showerhead include the Gamma xPR showerhead or the GxT drop-in showerhead available from Novellus Systems, Inc. of San Jose, Calif. In embodiments in which there is no showerhead assembly, the plasma enters the process chamber directly.

Process Chamber

The process chamber may be any suitable reaction chamber for the strip operation being performed. It may be one chamber of a multi-chambered apparatus or it may simply be a single chamber apparatus. The chamber may also include multiple stations where different wafers are processed simultaneously. The process chamber may be the same chamber where the implant, etch, or other resist-mediated process takes place. In other embodiments, a separate chamber is reserved for the strip. Process chamber pressure may range from about 600 mTorr to 2 Torr. In certain embodiments, the pressure ranges from about 0.9 Torr to 1.5 Torr.

The process chamber includes one or more processing stations on which strip operations are performed. In certain embodiments, the one or more processing stations includes a preheat station, at least one strip station, and an over-ash station. The wafer support is configured to support the wafer during processing. The wafer support may also transfer heat to and from the wafer during processing to adjust the wafer temperature as necessary. In certain embodiments, the wafer is supported on a plurality of minimum contacts and does not physically contact the wafer support surface plane. A spindle picks up the wafer and transfers the wafer from one station to another.

Figure 8:
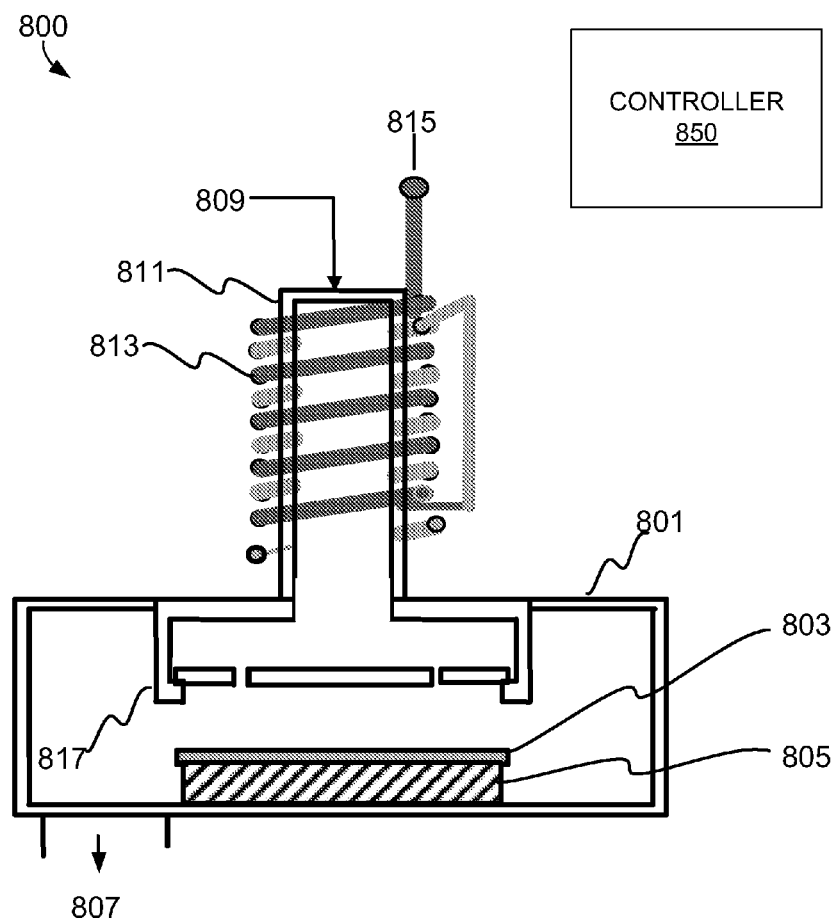
FIG. 8 is a schematic illustration showing an apparatus suitable for implementing aspects of the present invention.

FIG. 8 is a schematic illustration showing aspects of a downstream plasma apparatus 800 suitable for practicing the present invention on wafers. Apparatus 800 has a plasma producing portion 811 and an exposure chamber 801 separated by a showerhead assembly 817. Inside exposure chamber 801, a wafer 803 rests on a platen (or stage) 805. Platen 805 is fitted with a heating/cooling element. In some embodiments, platen 805 is also configured for applying a bias to wafer 803. Low pressure is attained in exposure chamber 401 via vacuum pump via conduit 807. Sources of gaseous hydrogen (with or without dilution/carrier gas) and carbon dioxide (or other weak oxidizing agent) provide a flow of gas via inlet 809 into plasma producing portion 811 of the apparatus. Plasma producing portion 811 is surrounded in part by induction coils 813, which are in turn connected to a power source 815. During operation, gas mixtures are introduced into plasma producing portion 811, induction coils 813 are energized and a plasma is generated in plasma producing portion 811. Showerhead assembly 817 may have an applied voltage or be grounded directs the flow of species into exposure chamber 801. As mentioned, wafer 803 may be temperature controlled and/or a RF bias may be applied. Various configurations and geometries of the plasma source 811 and induction coils 813 may be used. For example, induction coils 813 may loop around the plasma source 811 in an interlaced pattern. In another example, the plasma source 811 may be shaped as a dome instead of a cylinder. A controller 850 may be connected to components of the process chamber, and control process gas composition, pressure, temperature and wafer indexing of the stripping operations. Machine-readable media may be coupled to the controller and contain instructions for controlling process conditions for these operations.

Suitable plasma chambers and systems include the Gamma 2100, 2130 I$^2$CP (Interlaced Inductively Coupled Plasma), G400, and GxT offered by Novellus Systems, Inc. of San Jose, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various strip chambers may be configured onto cluster tools. For example, a strip chamber may be added to a Centura cluster tool available from Applied Materials of Santa Clara, Calif.

Work Piece

In preferred embodiments, the work piece used in accordance with the methods and apparatus of the invention is a semiconductor wafer. Any size wafer may be used. Most modern wafer fabrication facilities use either 200 mm or 300 mm wafers. As disclosed above, the process and apparatus disclosed herein strips photoresist after a processing operation such as etching, ion implant, or deposition. The present invention is suitable for wafers having very small features or critical dimensions, e.g., sub 100 nm, at 65 nm, or at or less than 45 nm. The low silicon loss feature of the HDIS as disclosed is particularly suitable for very shallow junctions of advanced logic devices. The present invention is also specifically suitable for wafers undergoing front end of the line (FEOL) ion implantation, especially high-dose ion implantation.

The plasma-activated species reacts with the photoresist and sputter residue on the wafer. At the wafer, the reactive gas may include a number of plasma activated species, the inert gas, radicals, charged species, and gas by-products. The volume concentration of various hydrogen species may be about 20-80% of the gas at the wafer. The volume concentration of various fluorine species may be 0.01% to about 2% or less than 1%. The volume concentration of various species from the weak oxidizing agent may be 0.05 to about 5% or about 1.2%. These species may include $H_2^*$, $H_2^+$, $H^+$, $H^*$, $e^-$, OH, $O^*$, CO, $CO_2$, $H_2O$, HF, $F^*$, F, CF, $CF_2$, and $CF_3$.

Process conditions may vary depending upon the wafer size. In some embodiments of the invention, it is desired to keep the work piece at a particular temperature during the application of plasmas to its surface. Wafer temperatures can range between about 110 degrees and about 500 degrees Celsius. To reduce the likelihood of photoresist popping described above, wafer temperature is preferably increased slowly until enough crust has been removed and photoresist popping ceases to be a concern. Initial station temperature may be about 110 degrees to about 260 degrees Celsius, for example, about 240 degrees Celsius. Later stations can use higher temperatures such as 285 degrees Celsius and about 350 degrees Celsius successfully with good strip rates. In certain embodiments, the temperature is increased during NF3 spikes to reduce Si loss associated with these spikes.

EXAMPLE PROCESSES

Figure 7:
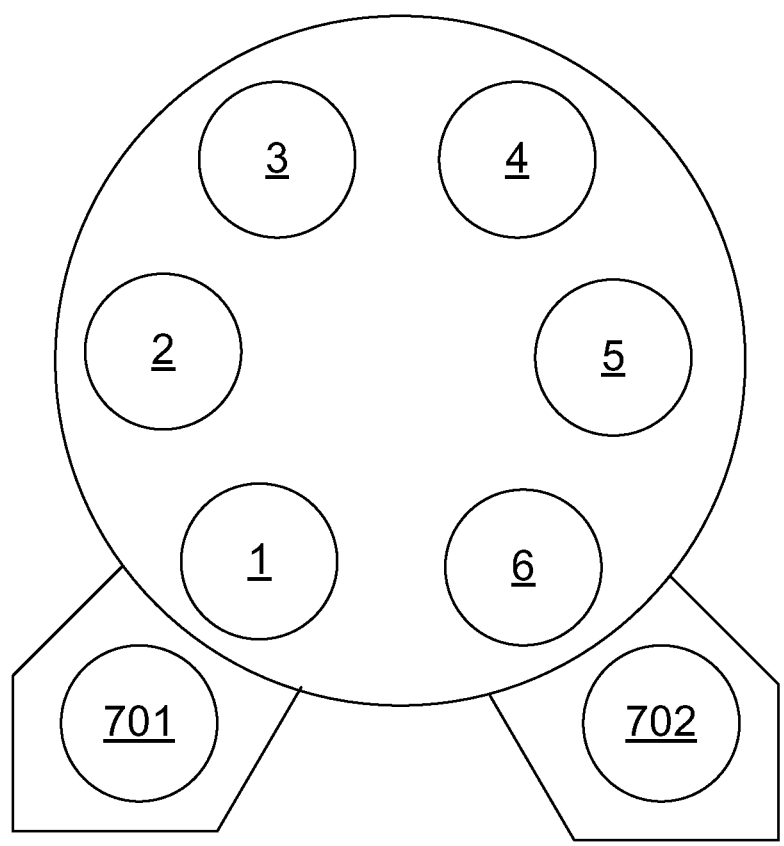
FIG. 7 shows a multi-station sequential architecture suitable for implementing aspects of the present invention.

As indicated above, in certain embodiments, a multi-station strip apparatus is employed to perform the photoresist and residue stripping processes described herein. FIG. 7 is a simplified schematic showing a top view of such an apparatus including stations 1, 2, 3, 4, 5 and 6. Wafers enter the apparatus at station 1 via chamber 701, are transferred to each station in sequence for a processing operation at that station and exit from station 6 via chamber 702 after the process is complete. The architecture allows hydrogen based residue free high dose implant strip process with low silicon loss and TiN metal gate compatibility.

Example Process 1

| Station | Operation | H2 Flow Rate (lpm) | CO2 Flow Rate (sccm) | NF3 Flow Rate (sccm) | CF4 Flow Rate (sccm) | Temperature (C.) |
|---|---|---|---|---|---|---|
| 1 | Pre-heat | 0 | 0 | 0 | 0 | 240 |
| 2 | Crust Removal | 2-3 | 32 | 15 | 100 | 240 |
| 3-5 | Bulk Photoresist Strip | 2-3 | 32 | 15 | 100 | 285 |
| 6 | Overash and Residue Clean | 2-3 | 32 | 50 | 0 | 350 |

The above process is an example of a process sequence including a NF3 spike in station 6.

Example Process 2

| Station | Operation | H2 Flow Rate (lpm) | CO2 Flow Rate (sccm) | NF3 Flow Rate (sccm) | CF4 Flow Rate (sccm) | Temperature (C.) |
|---|---|---|---|---|---|---|
| 1 | Pre-heat | 0 | 0 | 0 | 0 | 240 |
| 2 | Crust Removal (2-Stage) | 2-3 | 32 | 15 50 | 100 100 | 240 |
| 3-5 | Bulk Photoresist Strip | 2-3 | 32 | 15 | 100 | 285 |
| 6 | Overash and Residue Clean | 2-3 | 32 | 50 | 0 | 350 |

The above process is an example of a process sequence including a NF3 spike for half of the exposure time in station 2, during crust removal. For example, a wafer may be in the station for 18 seconds, with NF3 spiked for the second 9 seconds.

Example Process 3

| Station | Operation | H2 Flow Rate (lpm) | CO2 Flow Rate (sccm) | NF3 Flow Rate (sccm) | CF4 Flow Rate (sccm) | Temperature (C.) |
|---|---|---|---|---|---|---|
| 1 | Pre-heat | 0 | 0 | 0 | 0 | 240 |
| 2 | Crust Removal (2-Stage) | 2-3 | 32 | 50 50 | 100 0 | 240 |
| 3-5 | Bulk Photoresist Strip | 2-3 | 32 | 15 | 100 | 285 |
| 6 | Overash and Residue Clean | 2-3 | 32 | 50 | 0 | 350 |

The above process is an example of a process in which CF4 is shut off at a point during the station 2 exposure time, e.g., to aid in crust removal.

Example Process 4

| Station | Operation | H2 Flow Rate (lpm) | CO2 Flow Rate (sccm) | NF3 Flow Rate (sccm) | CF4 Flow Rate (sccm) | Temperature (C.) |
|---|---|---|---|---|---|---|
| 1 | Pre-heat | 0 | 0 | 0 | 0 | 240 |
| 2-5 | Bulk Photoresist Strip and Removal of Residue for Side Crust | 2-3 | 32 | 50 | 100 | 240 |
| 3-5 | Bulk Photoresist Strip | 2-3 | 32 | 15 | 100 | 285 |
| 6 | Overash and Residue Clean | 2-3 | 32 | 50 | 0 | 350 |

The above process sequences provide examples showing how the strip may be controlled by modifying the relative NF3 and CF4 flow rates.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of removing a resist from a work piece surface in a reaction chamber, the method comprising:

forming a first plasma from a process gas mixture comprising molecular hydrogen, a non-carbon-containing fluorine-containing gas and a protectant compound, wherein said non-carbon-containing fluorine-containing gas and said protectant compound are provided in a first volumetric flow ratio, wherein the volumetric ratio of the molecular hydrogen to the non-carbon-containing fluorine-containing gas is at least 10:1;

exposing the work piece surface to the first plasma to thereby remove a first portion of the resist from the work piece surface;

changing the volumetric flow ratio of said non-carbon-containing fluorine-containing gas and said protectant compound to form a second plasma; and exposing the work piece surface to the second plasma to thereby remove a second portion of the resist from the work piece surface.

2. The method of claim 1, wherein the protectant compound is a nitrogen-containing compound.

3. The method of claim 1, wherein the protectant compound is a fluorocarbon protectant compound.

4. The method of claim 3, wherein the fluorocarbon protectant compound is one of $CF_4$, $C_2F_6$, $CHF_3$, $CH_2F_2$, $C_3F_8$.

5. The method of claim 1, wherein the non-carbon-containing fluorine-containing gas is one of $NF_3$, $F_2$, HF or $SF_6$.

6. The method of claim 5, wherein the non-carbon-containing fluorine-containing gas is $NF_3$.

7. The method of claim 1, wherein the resist removed from the work piece surface comprises a high-dose implanted resist wherein the first or section portion of the resist includes crosslinked polymer chains.

8. The method of claim 7, wherein the work piece is substantially residue free of the high-dose implanted resist after removal and wherein less than about 2 angstroms silicon is lost from a silicon surface of the work piece.

9. The method of claim 7, wherein the work piece is substantially residue free of the high-dose implanted resist after removal and wherein less than about 1 angstrom silicon is lost from a silicon surface of the work piece.

10. The method of claim 1, wherein the first volumetric flow ratio of said non-carbon-containing fluorine-containing gas and said protectant compound is between about 1:20-1:5 and changing the volumetric flow ratio comprises changing the volumetric flow ratio to between about 1:4-1:2.

11. The method of claim 1, wherein the first volumetric flow ratio of the non-carbon-containing fluorine-containing gas and said protectant compound is between about 1:20-1:5.

12. The method of claim 1, wherein changing the volumetric flow ratio of said non-carbon-containing fluorine-containing gas and said protectant compound to form a second plasma comprises shutting off a flow of the protectant compound.

13. The method of claim 1, wherein the process gas mixture further comprises carbon dioxide.

14. The method of claim 1, wherein the resist is an ion-implanted resist including a crust portion and a bulk portion, wherein the crust portion is denser than the bulk portion, wherein the crust portion includes carbon and wherein at least some of the crust portion is removed by the first plasma.

15. A method of removing resist from a work piece surface in a reaction chamber, the method comprising:

forming a first plasma from a process gas mixture comprising molecular hydrogen, non-carbon-containing fluorine-containing gas and a protectant compound, wherein the volumetric ratio of the molecular hydrogen to the non-carbon-containing fluorine gas is at least 10:1; and exposing the work piece surface to the first plasma to thereby remove a first portion of resist from the work piece surface and simultaneously form a protective layer on a silicon-containing surface of the work piece, wherein the resist is an ion-implanted resist including a crust portion and a bulk portion, wherein the crust portion is denser than the bulk portion, wherein the crust includes carbon and wherein at least some of the crust is removed by the first plasma.

16. The method of claim 15, wherein the protectant compound is a nitrogen-containing compound.

17. The method of claim 15, wherein the protectant compound is a fluorocarbon protectant compound.

18. The method of claim 15, wherein the non-carbon-containing fluorine-containing gas is one of $NF_3$, $F_2$, HF or $SF_6$.

19. The method of claim 15, wherein the protectant compound is $CF_4$ and the non-carbon-containing fluorine-containing gas is $NF_3$.

20. The method of claim 15, wherein the process gas mixture further comprises carbon dioxide.

21. A method of removing high-dose implanted resist from a work piece surface in a reaction chamber, the method comprising:

removing a first portion of the high-dose implanted resist comprising:
introducing a first gas comprising molecular hydrogen, a weak oxidizing agent, a non-carbon-containing fluorine containing gas and a protectant gas into a plasma source, wherein the volumetric ratio of the molecular hydrogen to the non-carbon-containing fluorine gas is at least 10:1;
generating a first plasma from the first gas introduced into the plasma source; and
exposing the work piece to a first plasma to remove a first portion of the high-dose implanted resist;

and removing a second portion of the high-dose implanted resist by:
introducing a second gas comprising molecular hydrogen, a weak oxidizing agent, a non-carbon-containing fluorine containing gas and essentially no protectant gas into a plasma source;
generating a second plasma from the second gas introduced into the plasma source; and
exposing the work piece to the second plasma to remove a second portion of the high-dose implanted resist wherein the first or section portion of the high-dose implanted resist includes crosslinked polymer chains.

* * * * *